(12) United States Patent
Kasajima et al.

(10) Patent No.: US 8,735,736 B2
(45) Date of Patent: May 27, 2014

(54) ELECTRONIC COMPONENT MODULE AND ITS MANUFACTURING METHOD

(75) Inventors: Tamon Kasajima, Hong Kong (CN); Masashi Shiraishi, Hong Kong (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 171 days.

(21) Appl. No.: 13/278,450

(22) Filed: Oct. 21, 2011

(65) Prior Publication Data

US 2013/0075143 A1    Mar. 28, 2013

(30) Foreign Application Priority Data

Sep. 26, 2011  (CN) .......................... 2011 1 0288379

(51) Int. Cl.
*H05K 1/16*         (2006.01)
(52) U.S. Cl.
USPC .............................. 174/260; 361/800; 29/841
(58) Field of Classification Search
None
See application file for complete search history.

(56) References Cited

U.S. PATENT DOCUMENTS

| | | | | |
|---|---|---|---|---|
| 5,600,181 A | * | 2/1997 | Scott et al. | ..................... 257/723 |
| 7,180,012 B2 | * | 2/2007 | Tsuneoka et al. | ............. 174/521 |
| 7,187,060 B2 | * | 3/2007 | Usui | .............................. 257/659 |
| 7,446,262 B2 | * | 11/2008 | Ogawa et al. | .................. 174/255 |

FOREIGN PATENT DOCUMENTS

| | | |
|---|---|---|
| JP | 2002-208651 | 7/2002 |
| JP | 2003-142626 | 5/2003 |
| JP | 2006-332255 | 12/2006 |

* cited by examiner

*Primary Examiner* — Ishwarbhai B Patel
(74) *Attorney, Agent, or Firm* — Nixon & Vanderhye, P.C.

(57) ABSTRACT

The electronic component module includes a substrate; an electronic component mounted on an electronic component mounting surface of the substrate; an insulating body that covers the electronic component on the electronic component mounting surface of the substrate; and a metal film formed by electroless plating, the metal film covering an exterior surface of the insulating body and a side surface of the substrate. The substrate has a space section in which a space is formed, the space being dented inward of the substrate in the periphery of a surface opposite to the electronic component mounting surface of the substrate, and the metal film entirely covers at least one side surface of the electronic component module except for at least a portion located on a surface perpendicular to the electronic component mounting surface of the substrate in the space section.

20 Claims, 18 Drawing Sheets

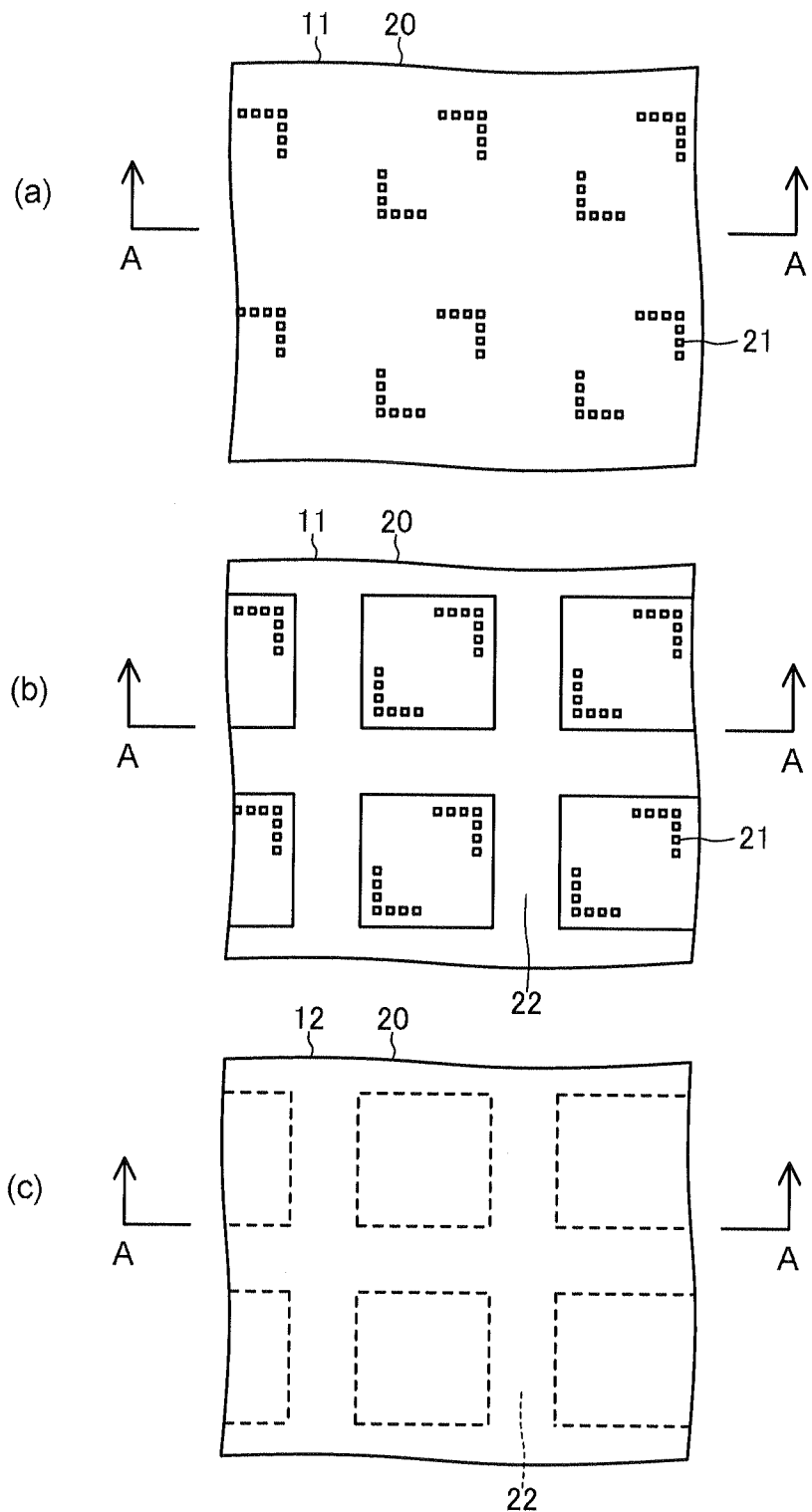

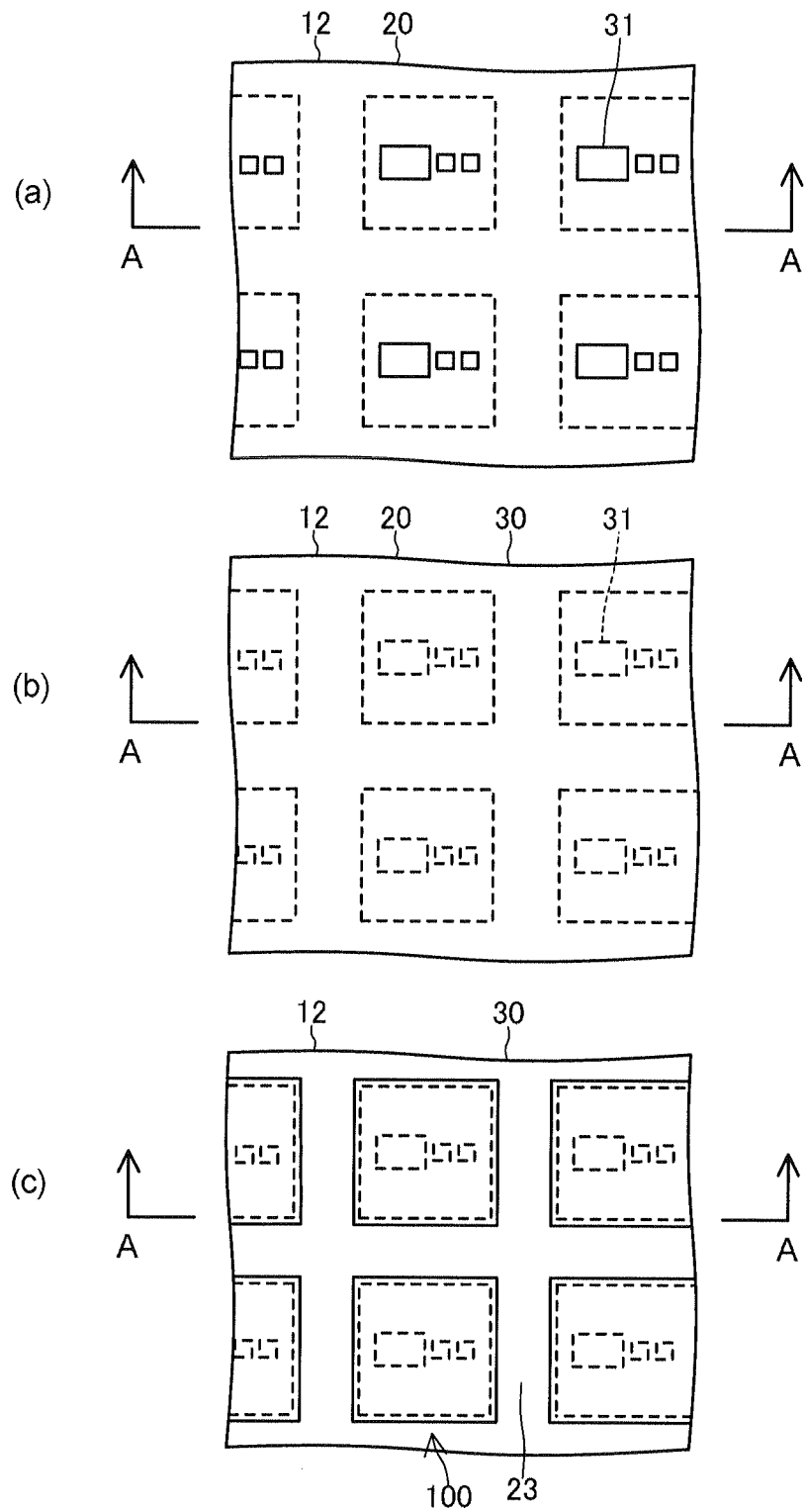

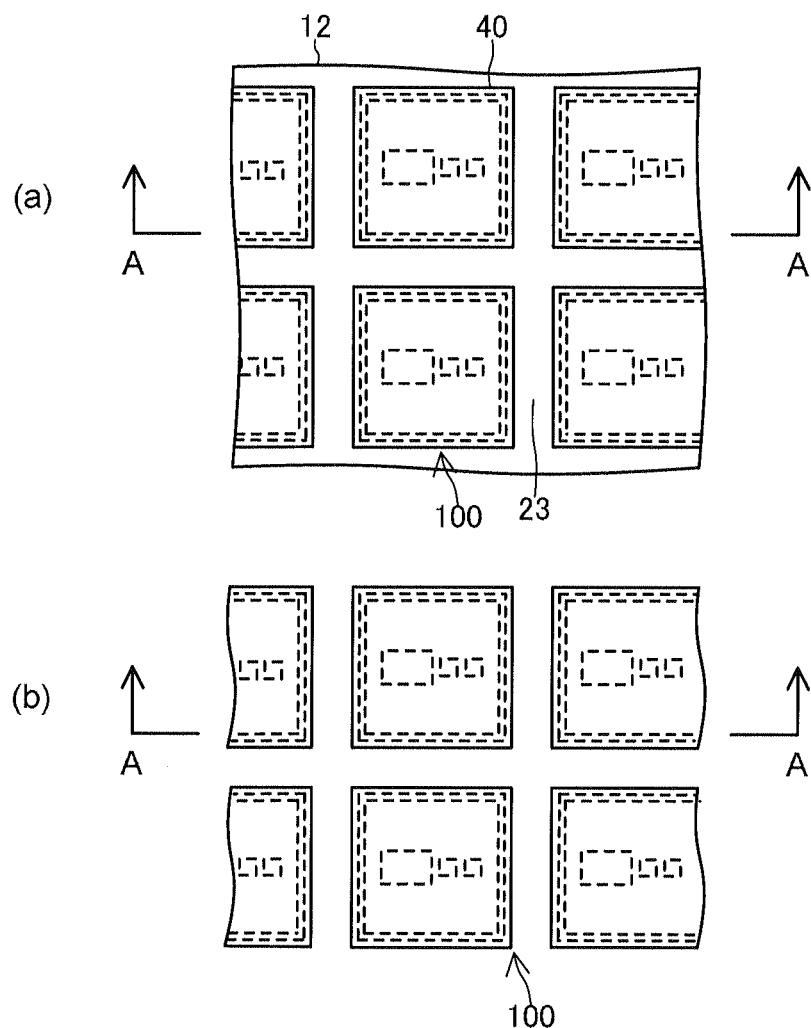

Fig.5
(a)
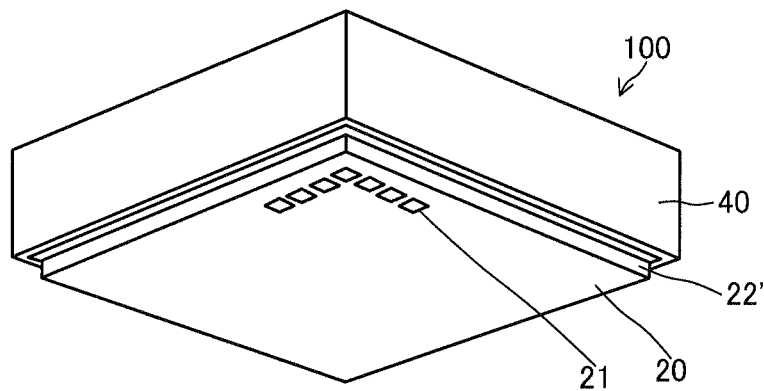
(b)
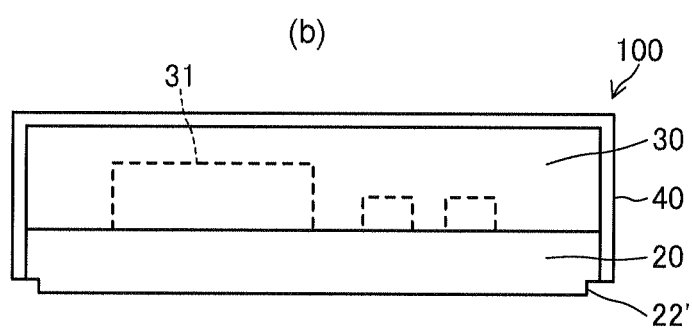

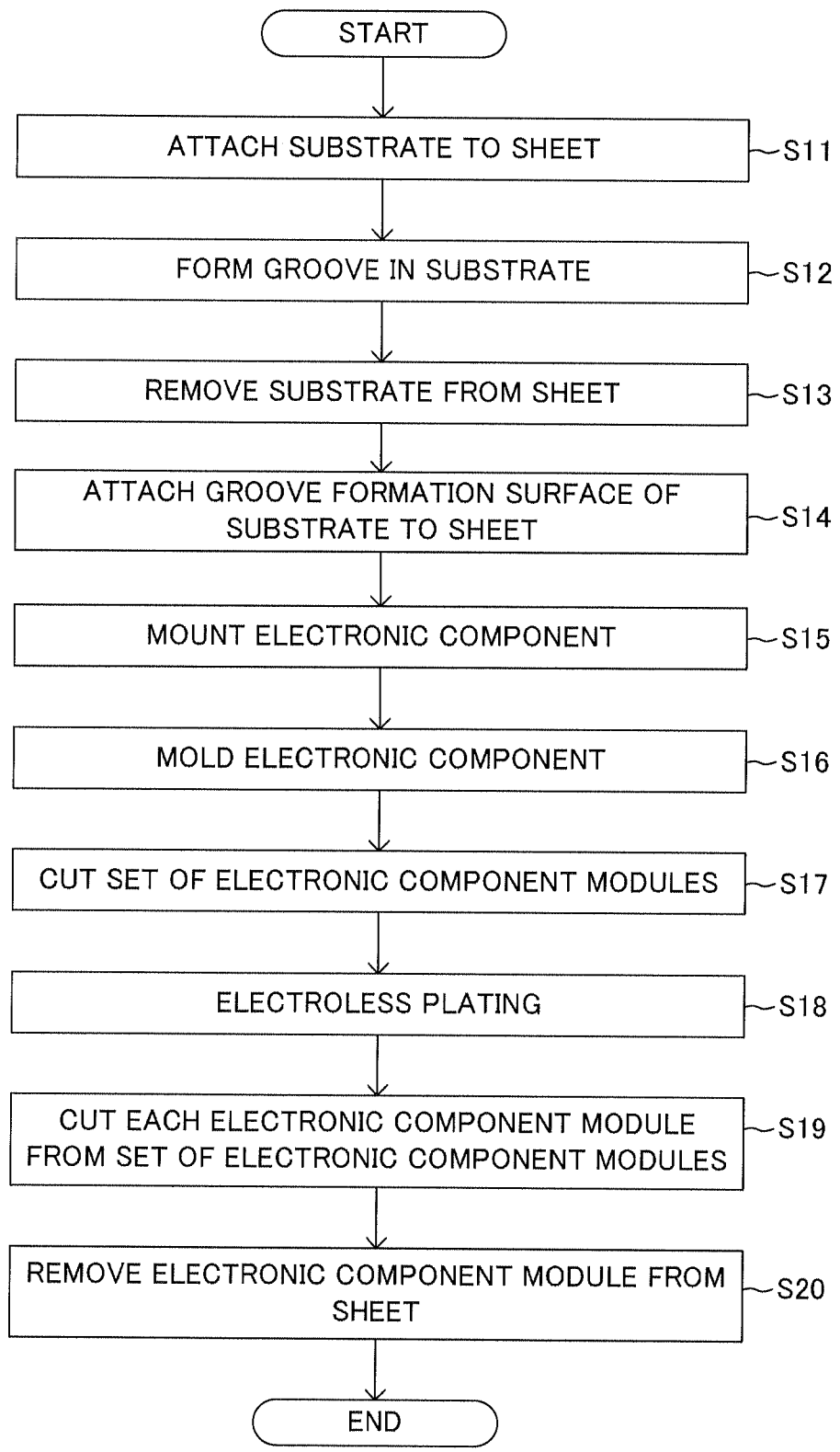

Fig.9
(a)
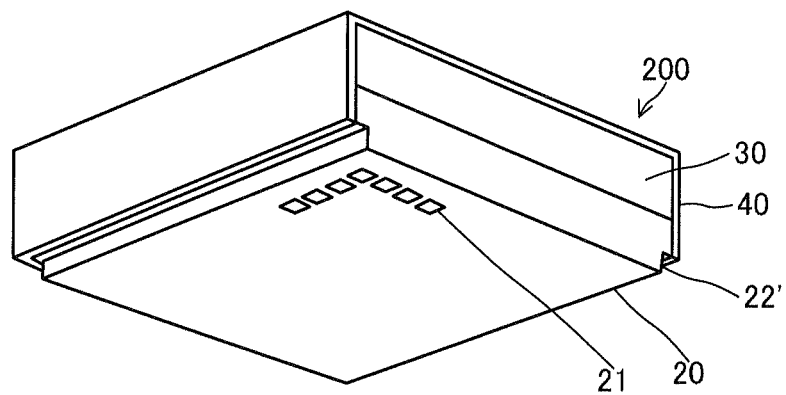
(b)
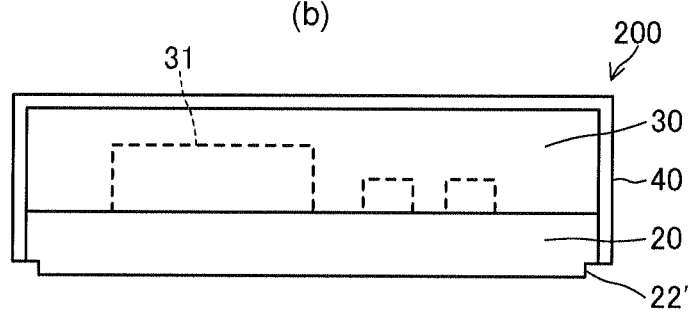

ELECTRONIC COMPONENT MODULE AND ITS MANUFACTURING METHOD

This application claims priority to Chinese Application No. 201110288379.7 filed 26 Sep. 2011 the entire contents of which is hereby incorporated by reference.

TECHNICAL FIELD

The present invention relates to electronic component modules, and in particular, to electronic component modules having electromagnetic wave shields. The present invention also relates to a method of manufacturing electronic component modules.

BACKGROUND ART

In order to take measures against electromagnetic waves such as prevention of electromagnetic wave leakage or electromagnetic wave penetration with respect to electronic components, electronic components are covered with electromagnetic wave shields in their peripheries. For example, JP 2003-142626 A (Patent Document 1) discloses a technique of covering the periphery of a semiconductor chip mounted on a substrate with a metal cap provided on the substrate. JP 2006-332255 A (Patent Document 2) discloses a technique of covering the periphery of a semiconductor chip mounted on a substrate and a part of the substrate up to a predetermined depth with a metal film by plating. Further, JP 2002-208651 A (Patent Document 3) discloses a technique of covering the periphery of a semiconductor chip mounted on a substrate and the periphery of the substrate, that is, side surfaces thereof, with a metal cap.

[Patent Document 1] JP 2003-142626 A
[Patent Document 2] JP 2006-332255 A
[Patent Document 3] JP 2002-208651 A However, the above-described techniques of covering electronic components with electromagnetic wave shields have the following disadvantages. In the techniques disclosed in Patent Documents 1 and 2, although the periphery of a semiconductor chip on the substrate is covered with an electromagnetic wave shield, all or part of the side surfaces of the substrate are not covered with the electromagnetic wave shield. This causes a problem of low electromagnetic wave shielding effect with respect to an electromagnetic component module.

Further, in the technique disclosed in Patent Document 3, although a substrate is covered with an electromagnetic wave shield up to the side surfaces, the manufacturing efficiency of electronic component modules is lowered. This means that in the technique of Patent Document 3, after each electronic component module is manufactured, it is necessary to dispose a metal cap for covering the top surface and the side surfaces thereof. As such, a plurality of numbers of electronic component modules cannot be manufactured at once, causing a problem that the manufacturing efficiency is lowered.

SUMMARY

In view of the above, an exemplary object of the present invention is to provide electronic component modules capable of solving the above-described problems such as low electromagnetic wave shielding effect and low manufacturing efficiency, and to provide a method of manufacturing the same.

In order to achieve the above object, an electronic component module according to an aspect of the present invention includes a substrate; an electronic component mounted on an electronic component mounting surface of the substrate; an insulating body that covers the electronic component on the electronic component mounting surface of the substrate; and a metal film formed by electroless plating, the metal film covering an exterior surface of the insulating body and a side surface of the substrate. The electronic component module is configured such that the substrate has a space section in which a space is formed, the space being dented inward of the substrate in the periphery of a surface opposite to the electronic component mounting surface of the substrate, and the metal film entirely covers at least one side surface of the electronic component module except for at least a portion located on a surface perpendicular to the electronic component mounting surface of the substrate in the space section.

Further, the electronic component module is configured such that the metal film entirely covers at least one side surface of the electronic component module except for a portion where the space section is formed.

Further, the electronic component module is configured such that the space section is formed in the entire periphery of the surface opposite to the electronic component mounting surface of the substrate, and the metal film entirely covers all side surfaces of the electronic component module.

Further, the electronic component module is configured such that the space section is formed in a stepped shape.

Further, the electronic component module is configured such that the space section formed in the stepped shape is formed such that a height in a thickness direction of the substrate is in a range from 5 μm to 50 μm and a depth is 50 μm or more.

According to the present invention configured as described above, as the electronic component module is configured such that the entire side surfaces of the electronic module, from which electromagnetic waves are easily leaked or which are easily affected by electromagnetic waves, are covered with a metal film, the electromagnetic wave shielding effect can be improved. Further, in the manufacturing process, even if a metal film is formed in a state where a surface opposite to the electronic component mounting surface of the substrate constituting the electronic component module is disposed on a predetermined sheet member, as a space section is formed in the periphery of the surface disposed on the sheet member, it is possible to prevent the metal film from being formed in the space section. Accordingly, the metal film, formed on at least one side surface of the electronic component module, will never be formed to be linked with the sheet member. As a result, the sheet member can easily be torn off from the electronic component module, whereby the manufacturing efficiency can be improved.

According to another aspect of the present invention, an electronic module manufacturing method includes mounting an electronic component on an electronic component mounting surface of a substrate; covering the electronic component with an insulating body on the electronic component mounting surface of the substrate; in a state where the substrate is disposed on a predetermined sheet member, cutting into a piece of electronic component module or a set of electronic component modules while remaining at least a part of the sheet member; covering an exterior surface of the insulating body and a side surface of the substrate with a metal film by electroless plating; and before the substrate is disposed on the predetermined sheet member, providing a space section in which a space, dented inward of the substrate, is formed in at least a part of the periphery of a surface opposite to the electronic component mounting surface of the substrate in a state where the electronic component module or the set of electronic component modules are cut.

Further, in the electronic module manufacturing method, the covering with the metal film includes entirely covering, with the metal film, at least one side surface of the electronic component module except for at least a portion located on a surface perpendicular to the electronic component mounting surface of the substrate in the space section.

Further, in the electronic module manufacturing method, the covering with the metal film includes entirely covering, with the metal film, at least one side surface of the electronic component module except for a portion where the space section is formed.

Further, in the electronic module manufacturing method, the providing the space section includes forming a space, dented inward of the substrate, in the entire periphery of the surface opposite to the electronic component mounting surface of the substrate, and the covering with the metal film includes entirely covering all side surfaces of the electronic component module.

Further, in the electronic module manufacturing method, the providing the space section includes forming the space section in a stepped state and forming the space section such that a height in a thickness direction of the substrate is in a range from 5 μm to 50 μm and a depth is 50 μm or more.

Further, the electronic module manufacturing method includes, after the covering with the metal film, attaching another sheet, capable of withstanding reflow of a predetermined temperature, on a surface covered with the metal film located opposite to the predetermined sheet member, and tearing off the predetermined sheet member from the surface opposite to the electronic component mounting surface of the substrate, and then applying a solder paste on a predetermined terminal previously provided on the surface opposite to the electronic component mounting surface of the substrate, and performing reflow, thereby forming a solder bump on the predetermined terminal.

As the present invention is configured as described above, it is possible to improve the manufacturing efficiency of electronic component modules while improving the electromagnetic wave shielding effect thereof.

BRIEF DESCRIPTION OF THE DRAWINGS

FIG. 2A (a, b, c) is an illustration showing states of respective steps of manufacturing the electronic component modules according to the first exemplary embodiment of the present invention;

FIG. 2B (a, b, c) is an illustration showing states of respective steps of manufacturing the electronic component modules according to the first exemplary embodiment of the present invention, following FIG. 2A;

FIG. 2C (a, b) is an illustration showing states of respective steps of manufacturing the electronic component modules according to the first exemplary embodiment of the present invention, following FIG. 2B;

FIG. 5 (a, b) is an illustration showing the configuration of an electronic component module according to the first exemplary embodiment of the present invention;

FIG. 6 is a flowchart showing operation of manufacturing electronic component modules according to a second exemplary embodiment of the present invention;

FIG. 9 (a, b) is an illustration showing the configuration of an electronic component module according to the second exemplary embodiment of the present invention;

Exemplary Embodiments

<First Exemplary Embodiment>

Figure 1:
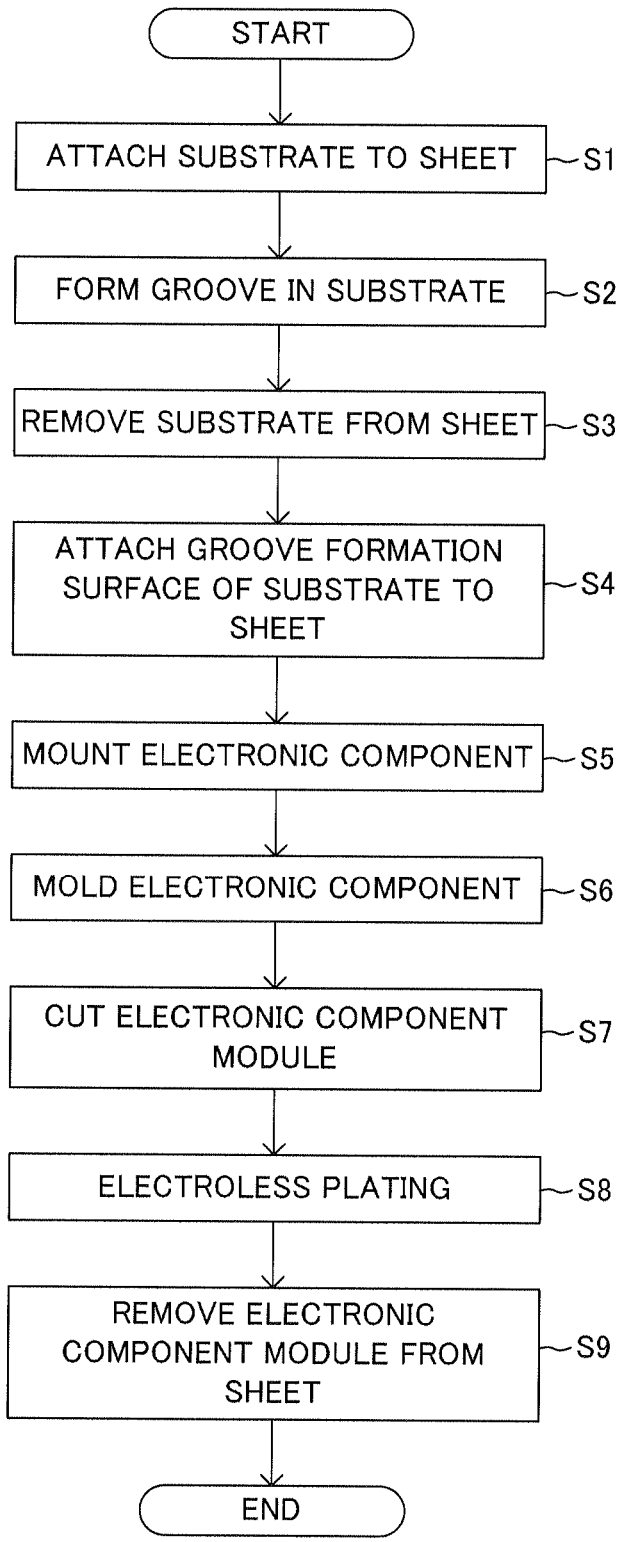
FIG. 1 is a flowchart showing operation of manufacturing electronic component modules according to a first exemplary embodiment of the present invention.
Figure 3A:
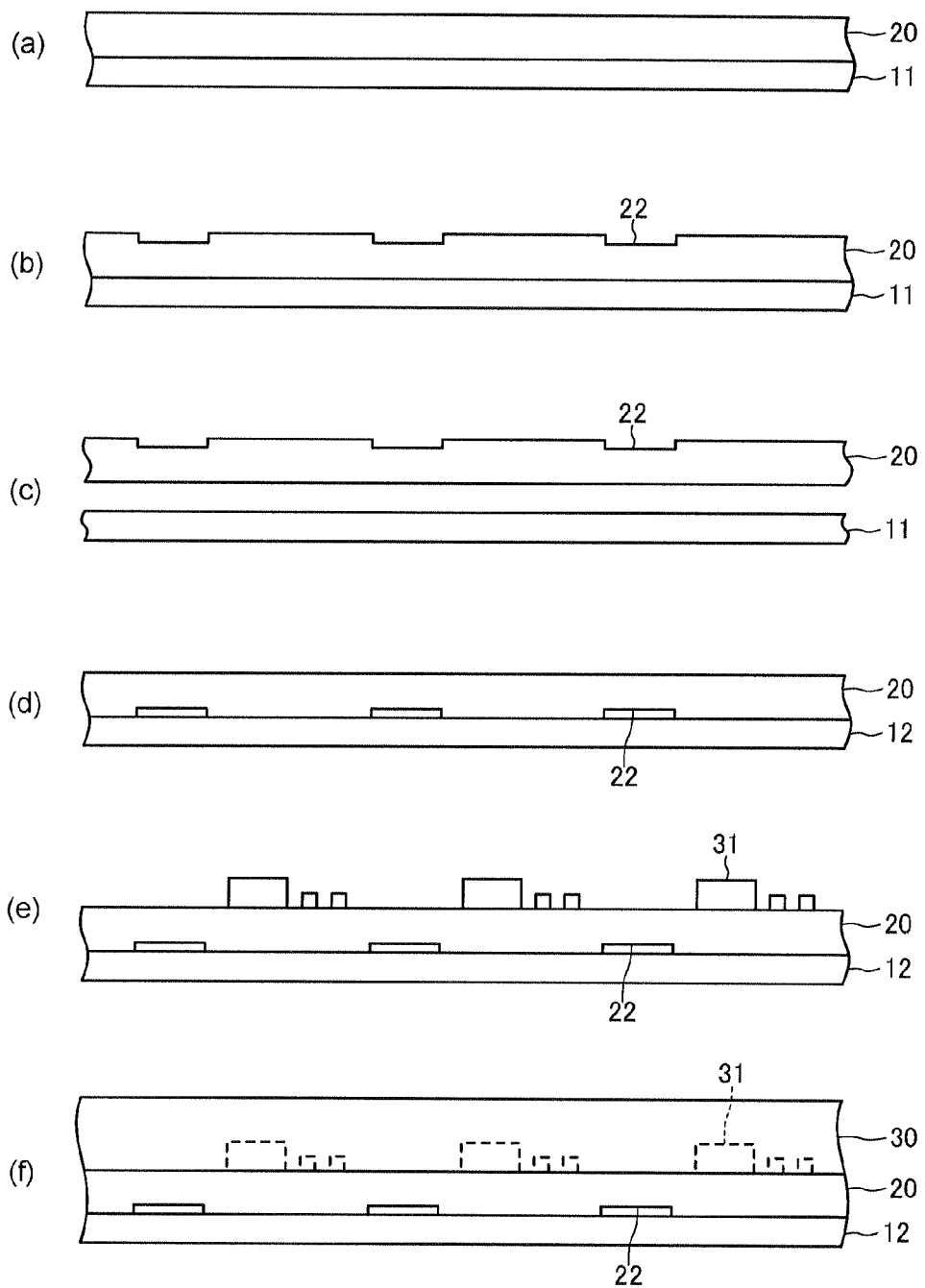
FIG. 3A (a, b, c, d, e, f) is an illustration showing cross-sectional views taken along the line A-A shown in FIGS. 2A to 2C in the respective steps of manufacturing the electronic component modules according to the first exemplary embodiment of the present invention.
Figure 3B:
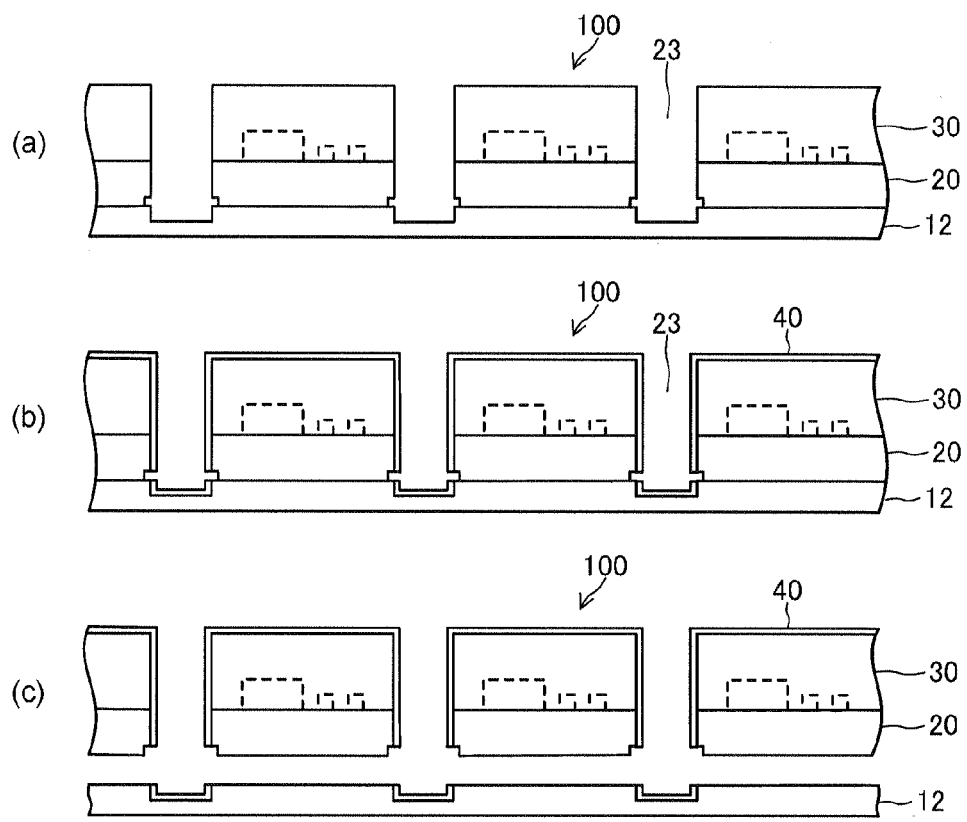
FIG. 3B (a, b, c) is an illustration showing cross-sectional views taken along the line A-A shown in FIGS. 2A to 2C in the respective steps of manufacturing the electronic component modules according to the first exemplary embodiment of the present invention, following FIG. 3A.
Figure 3C:
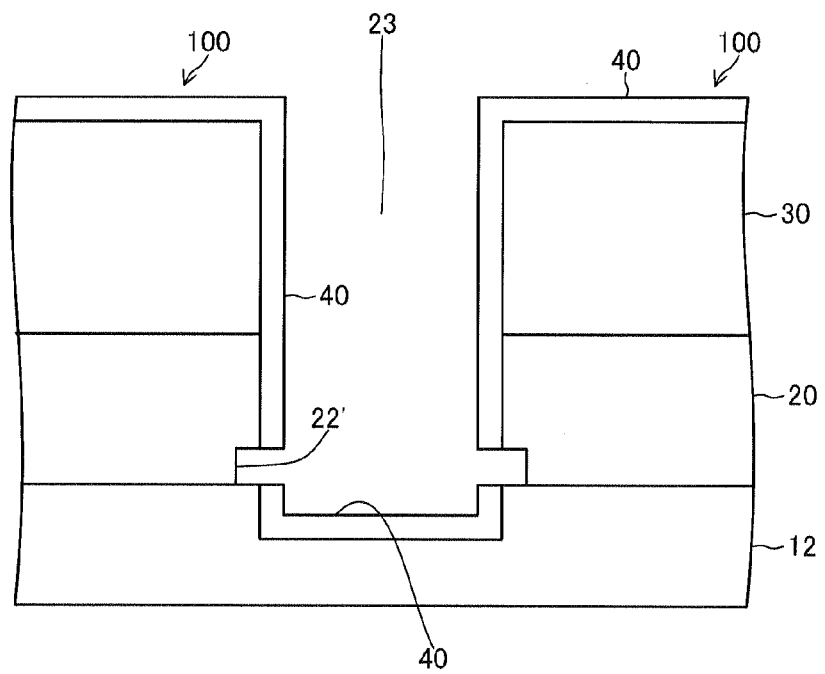
FIG. 3C is a partial enlarged view of FIG. 3B(b), showing the configuration of an electronic component module according to the first exemplary embodiment of the present invention.
Figure 4:
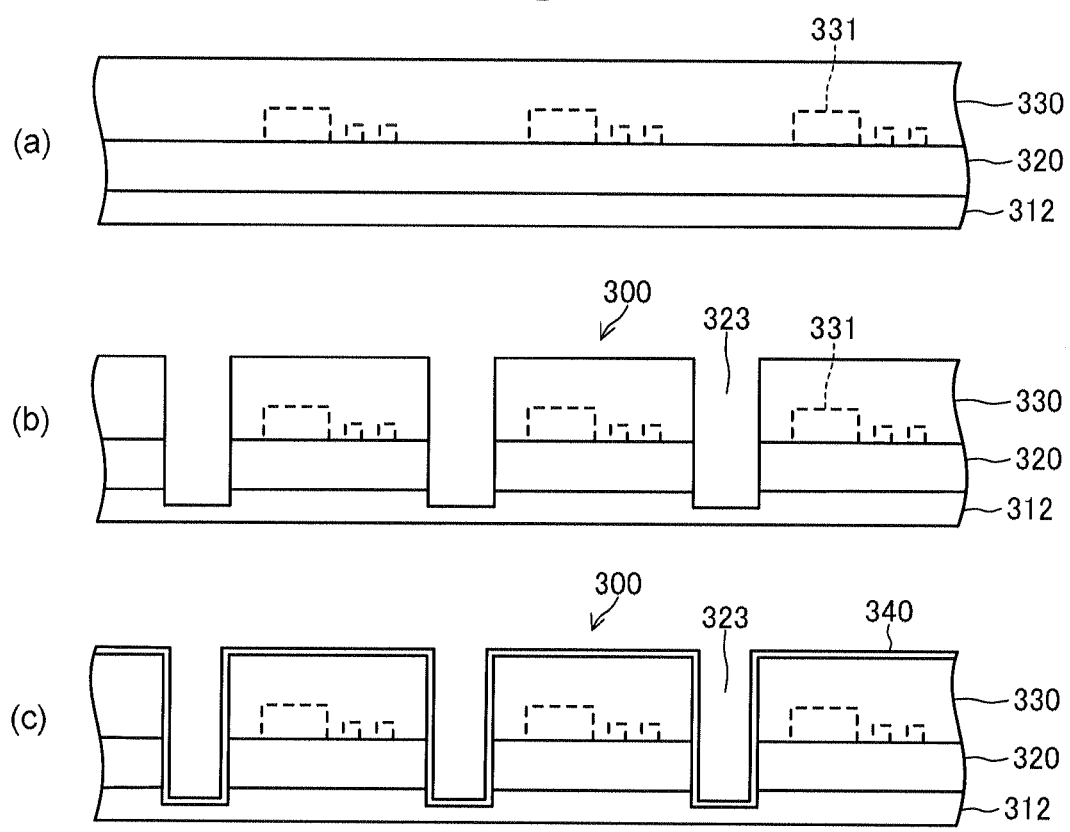
FIG. 4 (a, b, c) is an illustration showing states of respective steps in a method of manufacturing electronic component modules to be compared with those of the present invention.

A first exemplary embodiment of the present invention will be described with reference to FIGS. 1 to 5. FIG. 1 is a flowchart showing the operation of manufacturing electronic component modules according to the present embodiment. FIGS. 2A to 3C are illustrations showing states of respective steps of manufacturing the electronic component modules according to the present embodiment. FIG. 4 is an illustration showing states of respective steps of a method of manufacturing electronic component modules to be compared with the present invention. FIG. 5 is an illustration showing the configuration of an electronic component module according to the present embodiment.

Hereinafter, a method of manufacturing electronic component modules according to the present embodiment will be described with reference to FIGS. 1 to 4. FIGS. 2A to 2C are views seen from above a substrate 20. FIGS. 3A to 3C are views seen from a side of the substrate 20, showing cross-sectional views taken along the line A-A shown in FIGS. 2A to 2C. FIG. 5 shows the configuration of an electronic component module of the present embodiment. It should be noted that an electronic component module of the present embodiment is configured such that an electronic component mounted on the substrate is molded with an insulating body, and the periphery thereof is shielded with respect to electromagnetic waves.

First, as shown in FIGS. 2A(a) and 3A(a), the substrate 20 on which a plurality of connecting terminal 21 are formed is attached to a viscous first sheet 11 (step S1). At this step, an electronic component mounting surface of the substrate 20, which is the surface opposite to the connecting terminal formation surface on which the connecting terminals 21 are formed, is attached to the first sheet 11.

The substrate 20 is a printed board such as a glass epoxy board or an alumina board, for example. The substrate 20 has a size sufficient for forming 144 pieces of electronic component modules 100 in total, constituted of 12 pieces vertically by 12 pieces horizontally. For the respective electronic component modules 100, connecting terminals 21 are formed on one surface (connecting terminal formation surface), and conductor patterns for mounting electronic components are formed on the other surface (electronic component mounting surface). The connecting terminals 21 and the conductor patterns are formed such that the respective electronic component modules 100 are formed with intervals between 100 μm and 300 μm. It should be noted that FIGS. 2 and 3 only show part of the substrate 20, and part of the connecting terminals 21. Further, the size of the substrate 20 is not limited to the above-described size.

Further, the first sheet 11 may be a UV sheet, for example. However, any type of sheet may be used if it has viscosity for fixing the substrate 20. It should be noted that the viscosity of the first sheet 11 is of a level with which the attached substrate 20 will be able to be torn off easily. The viscous material exhibiting the viscosity of the sheet is desirably one which is less subjected to corrosion by a plating solution described below. A second sheet 12, described below, also has a similar configuration to that of the first sheet 11.

Then, as shown in FIGS. 2A(b) and 3A(b), grooves 22 having a predetermined depth are formed in a grid in the connecting terminal formation surface of the substrate 20 attached to the first sheet 11 (step S2). The grooves 22 are located at external portions of the connecting terminal formation surfaces of the electronic component modules 100, forming a stepped space section 22' inward with respect to the side surfaces of each of the electronic component modules 100, as described below (see FIG. 5).

The grooves 22 are formed in such a manner that a resist is formed on the connecting terminal forming surface of the substrate 20, the resist is removed partially to form groove patterns, and etching is applied, for example. The depth of the grooves 22, that is, the height of the grooves in a thickness direction of the substrate 20, is formed to be 5 μm, for example. However, the height of the grooves 22 is not limited to 5 μm. While any height is acceptable, the height is desirably in a range from 5 μm to 50 μm, such as 16 μm, 32 μm, 48 μm, or 50 μm, depending on the thickness of the resist. The reason thereof will be described below.

While the width of the grooves 22 is determined depending on the width of the groove patterns of the resist, it is formed to have a length (depth) such that the groove is dented inward by a predetermined length to the inside of the electronic component module 100 from the external form of the electronic component module 100, as described below. For example, the width of the groove 22 may be formed such that the groove is dented inward in a range from 50 μm to 100 μm from the external form to the inside of the electronic component module 100. Accordingly, if an interval between adjacent electronic component modules 100 over the groove 22 is in a range from 100 μm to 300 μm, in consideration of the length (depth) of the space section 22' formed inward from the external form to the inside of the electronic component module 100, it is necessary to form the width of the groove 22 to have a value from twice the length of 50 μm to twice the length of 100 μm. As such, the width should be in a range from 200 μm to 500 μm, for example. The grounds for setting the width of the groove 22 to have the above value will be described below.

Although the grooves 22 are formed by a solder resist process in the above description, the grooves 22 may be formed by means of cutting and processing with use of a blade, or by any other methods.

Then, as shown in FIG. 3A(c), the substrate 20 attached to the first sheet 11 is torn off to be removed from the first sheet 11 (step S3). Then, as shown in FIGS. 2A(c) and 3A(d), the connecting terminal formation surface of the substrate 20, that is, the groove formation surface where the grooves 22 are formed, is attached to a viscous second sheet 12 which is similar to the first sheet 11 (step S4). This means that the substrate 20 is turned over so that the groove formation surface becomes the lower side, and the second sheet 12 is attached to the groove formation surface. As the second sheet 12, the first sheet 11, just having been torn off, may be used.

Then, as shown in FIGS. 2B(a) and 3A(e), electronic components are mounted on the electronic component mounting surface which is a surface opposite to the groove formation surface of the substrate 20 (step S5). At this step, electronic components are respectively mounted at positions corresponding to the respective electronic component modules so as to form a plurality of electric circuits. Thereby, a set of electronic component modules 100 are formed.

Then, as shown in FIGS. 2B(b) and 3A(f), transfer molding is applied to the electronic component mounting surface of the substrate 20 using insulating resin to form a mold section 30 in a flat plate shape (step S6). As a molding method, a resin insert molding may be used, for example. It should be noted that any material may be used as insulating resin if the material is an insulating body.

Then, as shown in FIGS. 2B(c) and 3B(a), the set of electronic component modules 100, on which the mold section 30 is formed, is cut into pieces by cutting the portions between the respective electronic component modules, from the top surface of the mold section 30 (step S7). At this step, the depth of the cut portion 23 is a depth for cutting the mold section 30 and the substrate 20 up to a position of a predetermined thickness so as to leave a part of the second sheet 12 uncut. As such, although the electronic component modules 100 are cut into pieces, the second sheet 12 is not cut off completely so that a part thereof in a thickness direction remains. Therefore, even after the electronic component modules 100 are cut into pieces, as they are attached to the second sheet 12 which is in the form of one sheet, they can be conveyed easily.

The width of the cut portion 23 is set according to the preset intervals between the respective electronic component modules 100, which is in a range from 100 μm to 300 μm. When cutting, the position of the grooves 22 in a grid, formed in the groove formation surface (connecting terminal formation surface) of the substrate 20 as described above, is cut with a blade having a width narrower than that of the cut portion 23. As the grooves 22 are formed to be wider than the width of the cut portion 23, in the groove formation surface of the substrate 20 constituting each of the electronic component modules 100, both end portions in a width direction of the grooves 22 are formed as stepped space sections 22' (see FIG. 3C). Specifically, the external form of the groove formation surface side of the electronic component module 100 is formed to be cut away by 50 μm to 100 μm inward from the external form of the side surface of the electronic component module 100, so that the stepped space section 22' is formed. The height of the stepped space section 22' is equal to the depth (height) of the groove 22, which is in a range from 5 μm to 50 μm.

Then, as shown in FIGS. 2C(a) and 3B(b), the electronic component modules 100 attached to the second sheet 12 are immersed in an electroless plating solution to thereby form a conductive metal film 40 on the exposed surfaces of the respective pieces of electronic component modules 100, that is, the external surfaces of the mold section 30 and the side surfaces of the substrate 20 (step S18). Thereby, an electromagnetic wave shield is formed by the metal film 40 on the entire external surfaces (except for the connecting terminal formation surface of the substrate 20) of each of the electronic component modules 100, so that the magnetism leakage prevention effect and the magnetism shielding effect can be improved.

Further, in the present invention, as the space section 22' is formed in the periphery of the surface attaching the second sheet 12 of the electronic component module 100, the metal film 40 is not formed on the portions where the space section 22' is formed, so that the electronic component module 100 and the second sheet 12 will never be linked by the metal film 40.

FIG. 3C shows a partial enlarged view of FIG. 3B(b). As shown in FIG. 3C, even in the case where plating has been applied, the metal film 40 will never be formed inside the space section 22' which is a small gap formed in the periphery of the surface attaching the second sheet 12 of the electronic component module 100. In particular, by forming the space section 22' to have a height from 5 μm to 50 μm and a depth from 50 μm to 100 μm, electrons discharged by oxidization of a reducing agent contained in the plating solution will not enter the space section 22', whereby it is possible to effectively prevent attachment of the metal film 40 formed by the electroless plating in the space section 22'.

If the height of the space section 22' is less than 5 μm, the second sheet 12 and the substrate 20 may be linked by plating due to deflection or the like of the second sheet 12 for fixing the substrate 20. In that case, when removing the electronic component modules 100 from the second sheet 12, burrs due to plating may be caused, so it is undesirable. On the other hand, if the height of the space section 22' is higher than 50 μm, the space section 22' itself becomes high and a low height cannot be realized, so it is undesirable. Further, as there is a possibility that the plating solution enters the space section 22' and lubricate so that the inside of the groove is also plated, it is also undesirable. It should be noted that these are the results of experiments conducted by forming the space sections 22' of various heights.

Further, if the depth of the space section 22' is less than 50 μm, an enough space cannot be formed, and as electrons discharged by oxidization of the reducing agent contained in the plating solution easily enters the space, electroless plating might adhere to the space, so that it is undesirable. If the depth is 50 μm or more, electrons do not easily enter, so that electroless plating does not adhere. As such, the width can be increased without any limitation. However, because the stepped area of the space section 22' becomes larger, a disadvantage that the area of the shielded electronic component becomes larger is caused. Accordingly, the depth of the space section 22' is desirably in a range from 50 μm to 100 μm. This is a result of experiments conducted by forming the space sections 22' having depths from 50 μm to 100 μm by 10 μm.

As described above, the width of the cut portion 23 for cutting the electronic component modules 100 into pieces is desirably in a range from 100 μm to 300 μm. This is because while the respective electronic component modules 100 are formed adjacent to each other on the second sheet 12, with the cut portions 23 of the above width being formed, the metal film 40 can be formed without fail by electroless plating on the respective side surfaces of the electronic component modules 100 adjacent to each other. On the contrary, there is a disadvantage that if the width of the cut portion 23 is less than 100 μm, the portions where the electroless plating should be applied may not be applied, while if the width of the cut portion 23 is wider than 300 μm, the number of pieces of electronic component modules decreases.

It should be noted that although FIG. 3C shows a state where no metal film 40 is formed at all in the portion where the space section 22' is formed, the metal film 40 may be formed in a part of the space section 22'. Even in that case, it is only necessary that the metal film 40 is not formed on a portion located on the connecting terminal formation surface of the substrate 20 in the space section 22', particularly a portion located on the surface perpendicular to the electronic component mounting surface, that is, a connecting portion between the substrate 20 and the second sheet 12. This is realized by forming the space section 22' in the above-described manner, and in particular, forming the space section 22' to have the height and the depth as described above.

It should be noted that the space section 22' is not necessarily formed in a stepped shape as described above. For example, the space section 22' may be in any shape including a wedge shape, if a space is formed around the portion where the second sheet 12 and the substrate 20 contact each other. The shape of the space section 22' depends on the shape of both end portions in a width direction of the groove 22.

Then, as shown in FIGS. 2C(b) and 3B(c), the respective electronic component modules 100 are torn off to be removed from the second sheet 12 (step S9). When removing, as the substrate 20 of each of the electronic component modules 100 and the second sheet 12 are not linked by the metal film 40, the respective electronic component modules 100 can be removed easily from the second sheet 12.

Now, other electronic component modules, to be compared with those of the present invention, and the manufacturing method thereof will be described with reference to FIG. 4. First, as shown in FIG. 4(a), a substrate 320 is attached to a second sheet 312, electronic components 331 are mounted on the electronic component mounting surface of the substrate 320, and a mold section 330 is formed thereon. In this example, however, the above-described grooves 22 are not formed in the connecting terminal formation surface of the substrate 320.

Then, as shown in FIG. 4(b), the portions between the electronic component modules 300 are cut to thereby cut the respective electronic component modules 300 into pieces. At this time, as the cut portion 323 does not penetrate the second sheet 312, the second sheet 312 is not cut off, and a part thereof in a thickness direction remains.

Then, when electroless plating is applied, a conductive metal film 340 is formed on the exposed surfaces of the pieces of electronic component modules 300, as shown in FIG. 4(c). At this time, as the metal film 340 is also formed on the portions where the substrates 320 of the electronic component modules 300 and the second sheet 312 contact each other, the substrates 320 of the respective electronic component modules 300 and the second sheet 312 are linked by the metal film 340. As such, when removing the electronic component modules 300 from the second sheet 312, it is necessary to cut the edges of the electronic component mounting surfaces of the electronic component modules 300, which causes an additional operation, and further, cutting the metal film 340 may cause burrs.

On the other hand, in the present invention, as the space section 22' is formed as described above, the substrate 20 of the electronic component module 100 and the second sheet 12 are not linked by the metal film 40, so that the respective electronic component modules 100 can be removed easily from the second sheet 12. As a result, the manufacturing efficiency can be improved. Further, as shown in FIG. 5, in the electronic component modules 100 manufactured in this manner, all side surfaces except for the portions where the space sections 22' are formed are covered with the metal film 40. As such, the magnetism leakage prevention effect and the magnetism shielding effect can also be improved.

It should be noted that the drawings referred to in the above description show the method of manufacturing the electronic component modules 100 schematically, and the shape and the size of the respective components are not limited to those shown in the drawings. This also applies to the drawings referred to in other exemplary embodiments described below.

<Second Exemplary Embodiment>

A second exemplary embodiment will be described with reference to FIGS. 6 to 9. FIG. 6 is a flowchart showing the operation of manufacturing electronic component modules according to the present embodiment. FIGS. 7A to 8B are illustrations showing states of respective steps of manufacturing the electronic component modules according to the present embodiment. FIG. 9 is an illustration showing the configuration of an electronic component module according to the present embodiment.

Hereinafter, a method of manufacturing electronic component modules according to the present embodiment will be described with reference to FIGS. 6 to 8. FIGS. 7A to 7C are views seen from above a substrate 20. FIGS. 8A to 8C are views seen from a side of the substrate 20, showing cross-sectional views taken along the line B-B shown in FIGS. 7A to 7C. FIG. 9 shows the configuration of an electronic component module of the present embodiment. It should be noted that an electronic component module of the present embodiment has an almost similar configuration to that of the electronic component module manufactured in the first exemplary embodiment, except that an electronic component module 200 of the present embodiment is configured such that not all of the side surfaces are covered with an electromagnetic wave shield but only a part thereof is covered.

Figure 7A:
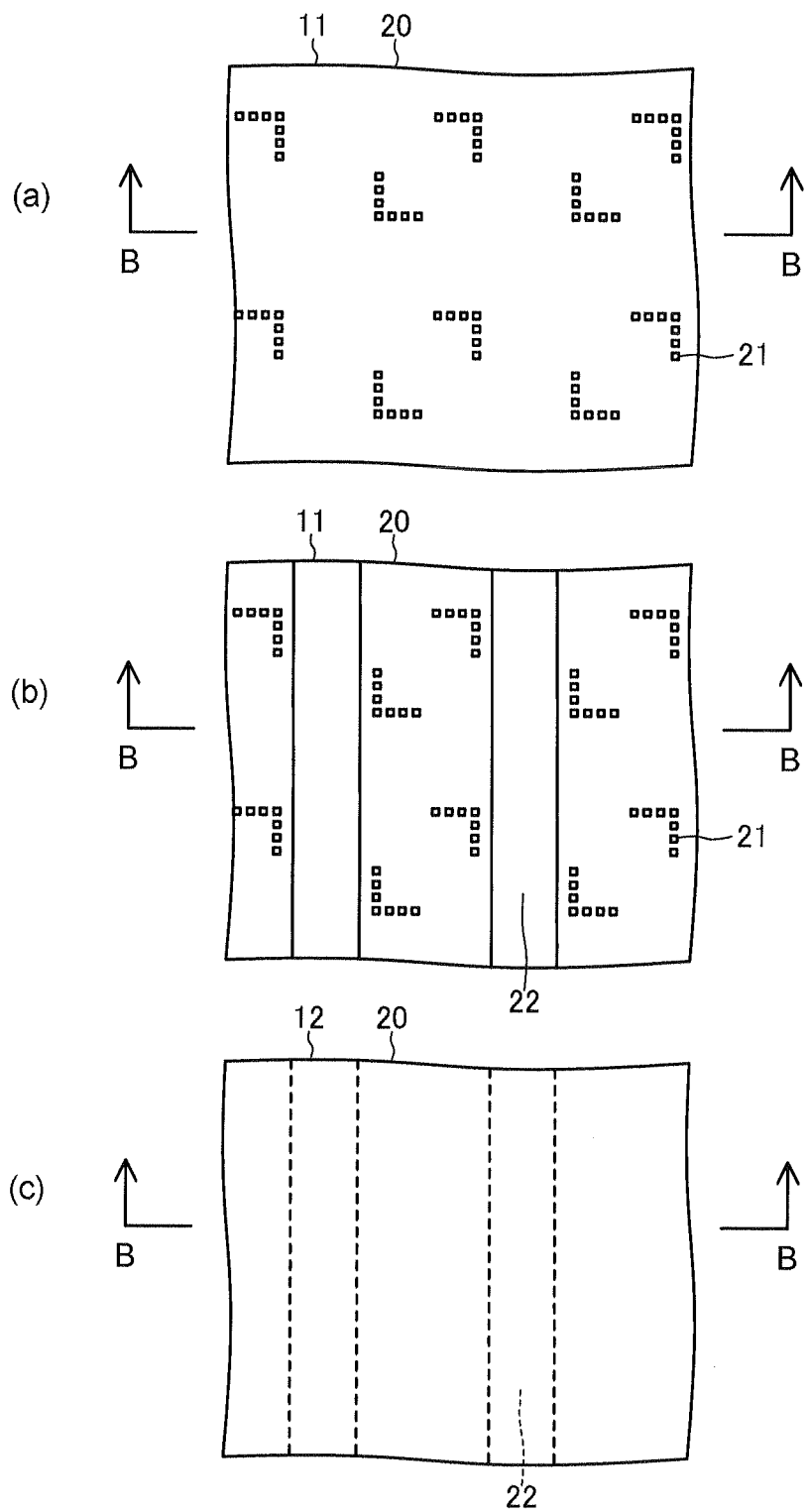
FIG. 7A (a, b, c) is an illustration showing states of respective steps of manufacturing the electronic component modules according to the second exemplary embodiment of the present invention.

First, as shown in FIGS. 7A(a) and 8A(a), the substrate 20 on which a plurality of connecting terminal 21 are formed is attached to a viscous first sheet 11 (step S11). At this step, an electronic component mounting surface of the substrate 20, which is the surface opposite to the connecting terminal formation surface on which the connecting terminals 21 are formed, is attached to the first sheet 11. The configurations of the substrate 20 and the like are similar to those described in the first exemplary embodiment.

Then, as shown in FIGS. 7A(b) and 7A(b), grooves 22 having a predetermined depth are formed in the connecting terminal formation surface of the substrate 20 attached to the first sheet 11 (step S12). At this step, the grooves 22 are formed linearly, rather than in a grid. This means that the grooves 22 are formed such that space sections 22' are formed only in two opposite sides facing each other on the connecting terminal formation surface of the substrate 20 constituting the electronic component module 200. The forming method, shape, size, and the like of the grooves 22 are similar to those described in the first exemplary embodiment.

Figure 8A:
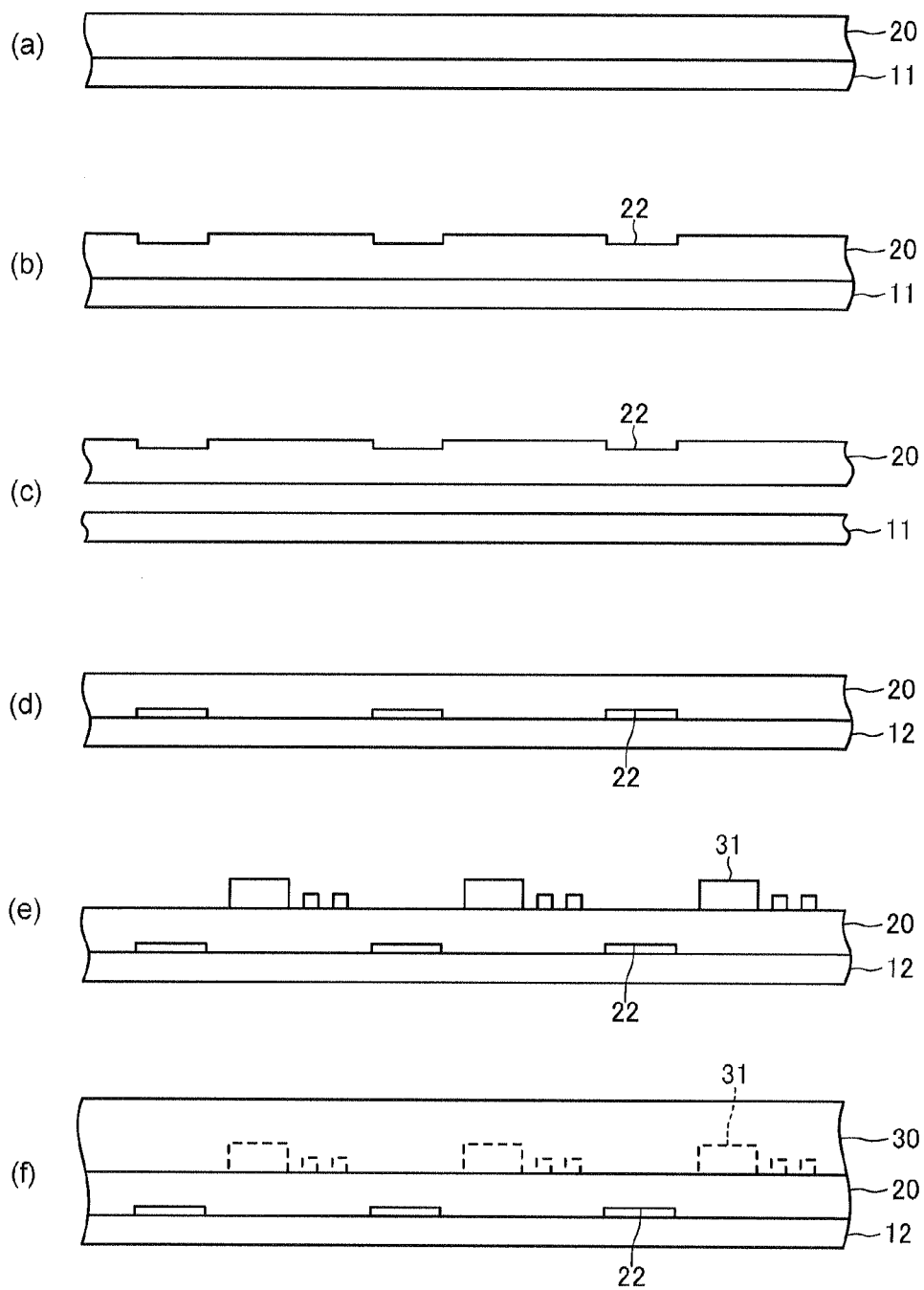
FIG. 8A (a, b, c, d, e, f) is an illustration showing cross-sectional views taken along the line B-B shown in FIGS. 7A to 7C in the respective steps of manufacturing the electronic component modules according to the second exemplary embodiment of the present invention.
Figure 8B:
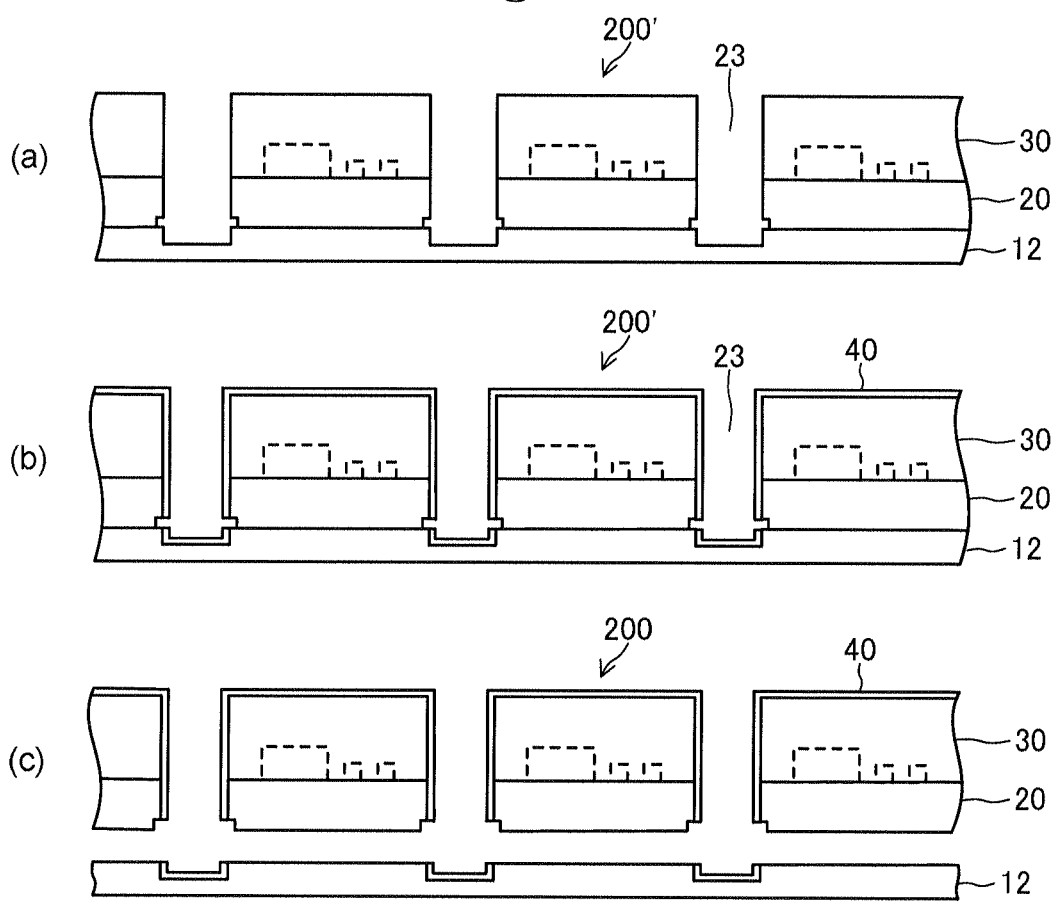
FIG. 8B (a, b, c) is an illustration showing cross-sectional views taken along the line B-B shown in FIGS. 7A to 7C in the respective steps of manufacturing the electronic component modules according to the second exemplary embodiment of the present invention, following FIG. 8A.

Then, as shown in FIG. 8A(c), the substrate 20 attached to the first sheet 11 is torn off to be removed from the first sheet 11 (step S13). Then, as shown in FIGS. 7A(c) and 8A(d), the connecting terminal formation surface of the substrate 20, that is, the groove formation surface where the grooves 22 are formed, is attached to a viscous second sheet 12 which is similar to the first sheet 11 (step S14). This means that the substrate 20 is turned over so that the groove formation surface becomes the lower side, and the second sheet 12 is attached to the groove formation surface. As the second sheet 12, the first sheet 11, just having been torn off, may be used.

Figure 7B:
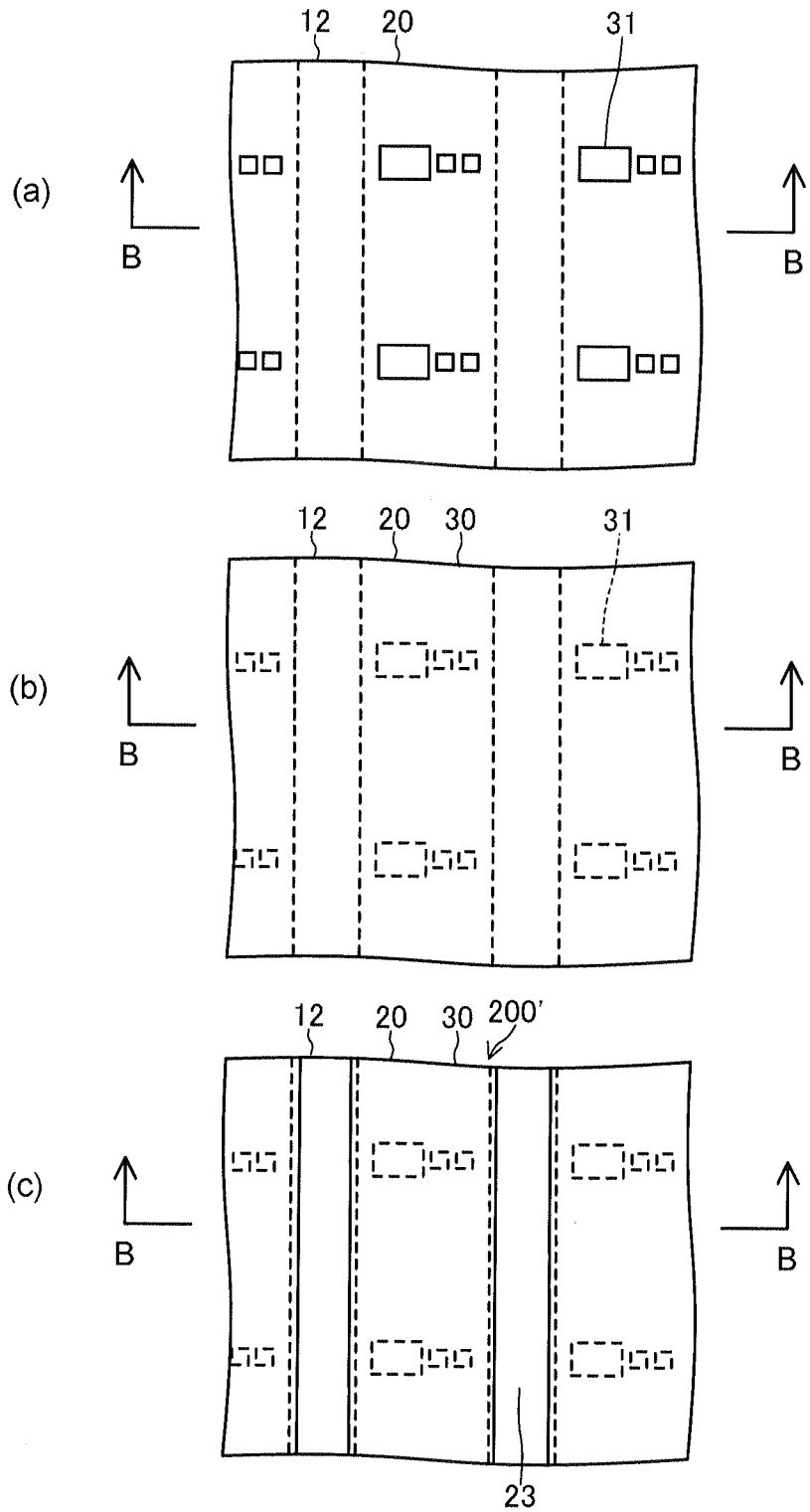
FIG. 7B (a, b, c) is an illustration showing states of respective steps of manufacturing the electronic component modules according to the second exemplary embodiment of the present invention, following FIG. 7A.

Then, as shown in FIGS. 7B(a) and 8A(e), electronic components are mounted on the electronic component mounting surface which is a surface opposite to the groove formation surface of the substrate 20 (step S15). At this step, electronic components are respectively mounted at positions corresponding to the respective electronic component modules so as to form a plurality of electric circuits. Thereby, a set of electronic component modules 200 are formed.

Then, as shown in FIGS. 7B(b) and 8A(f), transfer molding is applied to the electronic component mounting surface of the substrate 20 using insulating resin to form a mold section 30 in a flat plate shape (step S16). As a molding method, a resin insert molding may be used, for example. It should be noted that any material may be used as insulating resin if the material is an insulating body.

Then, as shown in FIGS. 7B(c) and 8B(a), the set of electronic component modules 200, on which the mold section 30 is formed, is cut into pieces by cutting the portions between the respective electronic component modules formed along the grooves 22, from the top surface of the mold section 30 (step S17). At this step, the depth of the cut portion 23 is a depth for cutting the mold section 30 and the substrate 20 up to a position of a predetermined thickness so as to leave a part of the second sheet 12 uncut. As such, although the set of electronic component modules 200' are cut into pieces, the second sheet 12 is not cut off completely so that a part thereof in a thickness direction remains.

The width of the cut portion 23 is narrower than the width of the groove 22, which is similar to the case of the first exemplary embodiment. As such, in the groove formation surface of the substrate 20 constituting each of the electronic component modules 200, stepped space sections 22' are formed only in two opposite sides facing each other (see FIG. 9). It should be noted that the dimension of the space section 22' is the same as that in the first exemplary embodiment.

Figure 7C:
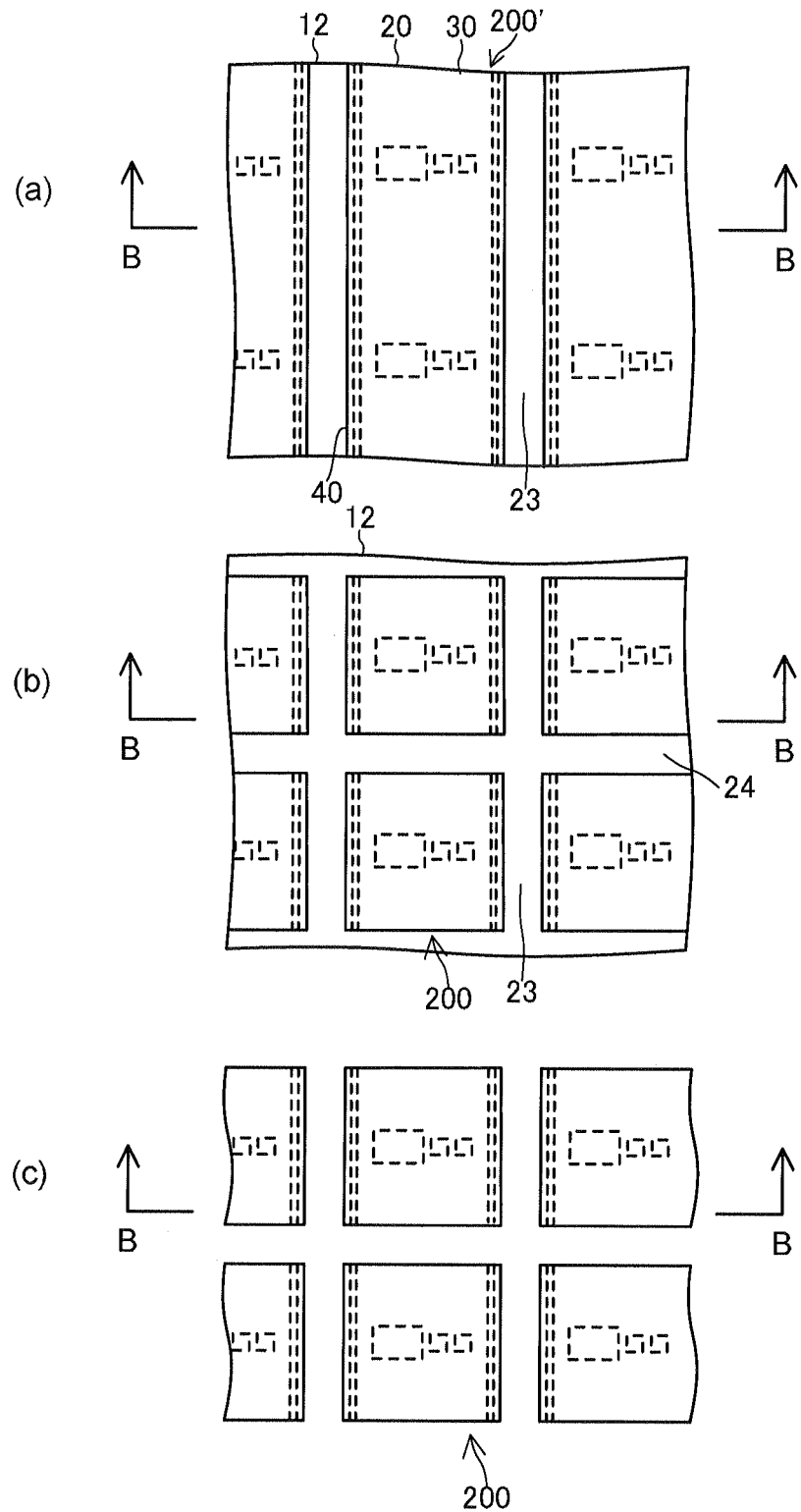
FIG. 7C (a, b, c) is an illustration showing states of respective steps of manufacturing the electronic component modules according to the second exemplary embodiment of the present invention, following FIG. 7B.

Then, as shown in FIGS. 7C(a) and 8B(b), the set of electronic component modules 200' attached to the second sheet 12 as described above are immersed in an electroless plating solution to thereby form a conductive metal film 40 on the exposed surfaces of the set of electronic component modules 200', that is, the outer surfaces of the mold section 30 and the side surfaces of the substrate 20 (step S18). Thereby, an electromagnetic wave shield is formed by the metal film 40 on the two opposite side surfaces facing each other, except for the connecting terminal formation surface of the substrate 20, of each of the electronic component modules 200, so that the magnetism leakage prevention effect and the magnetism shielding effect can be improved.

Further, in the present invention, as the space sections 22' are formed in part of the periphery of the surface attaching the second sheet 12 of the electronic component module 200, the metal film 40 is not formed on the portions where the space sections 22' are formed, so that the electronic component module 200 and the second sheet 12 will never be linked by the metal film 40.

Then, as shown in FIG. 7C(b), in order to cut the respective electronic component modules 200 into pieces from the set of electronic component modules 200' in which a plurality of electronic component modules 200 are aligned, the electronic component modules 200' are cut in a direction orthogonal to the linear cut portion 23 (step S19) (see reference numeral 24). The depth of the cut portion 24 is a depth for cutting the mold section 30 and the substrate 20 up to a position of a predetermined thickness so as to leave a part of the second sheet 12 uncut.

Then, as shown in FIGS. 7C(c) and 8B(c), the respective electronic component modules 200 are torn off to be removed from the second sheet 12 (step S20). When removing, as the substrate 20 of each of the electronic component modules 200 and the second sheet 12 are not linked by the metal film 40 as described above, the respective electronic component modules 200 can be removed easily from the second sheet 12. Further, as shown in FIG. 9, in the electronic component modules 200 manufactured in this manner, almost all parts of the two opposite side surfaces facing each other, except for the portions where the space sections 22' are formed, are covered with the metal film 40. As such, the magnetism leakage prevention effect and the magnetism shielding effect can also be improved.

While the above example has described the case of forming the metal film 40 serving as an electromagnetic wave shield on two opposite side surfaces facing each other of the electronic component module 200 having a rectangle external appearance and forming the space sections 22' in such side surfaces, it is possible to form the metal film 40 and the space section 22' on at least one side surface. For example, it is possible to form the groove 22 and the cut portion 23 before plating only on the location corresponding to one side surface of the electronic component module 200 and perform plating to thereby form the metal film 40 which covers only one side surface.

<Third Exemplary Embodiment>

Figure 10:
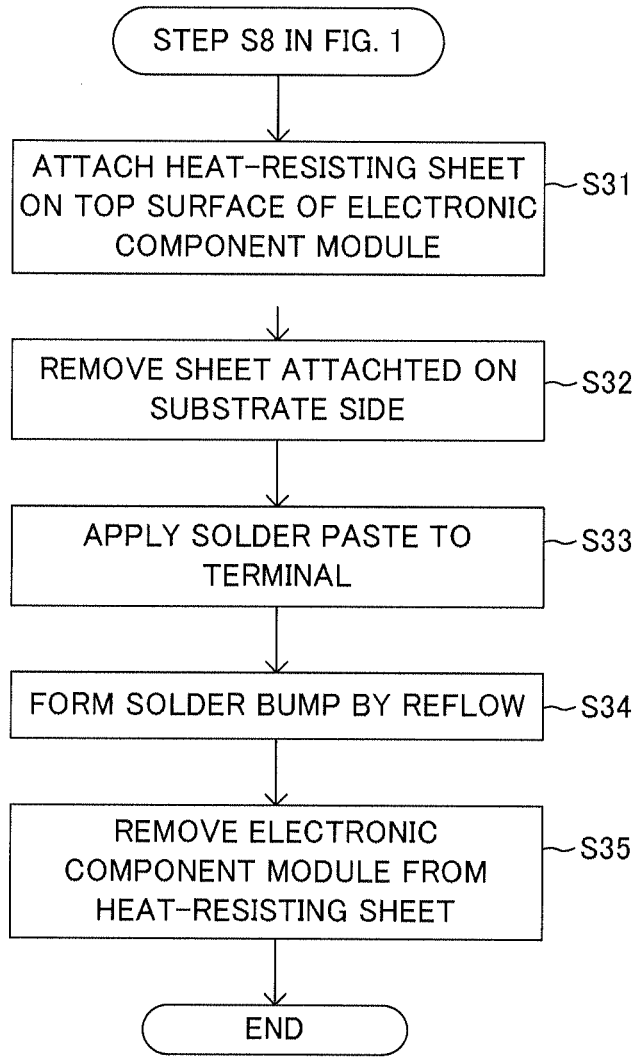
FIG. 10 is a flowchart showing operation of manufacturing electronic component modules according to a third exemplary embodiment of the present invention.
Figure 11:
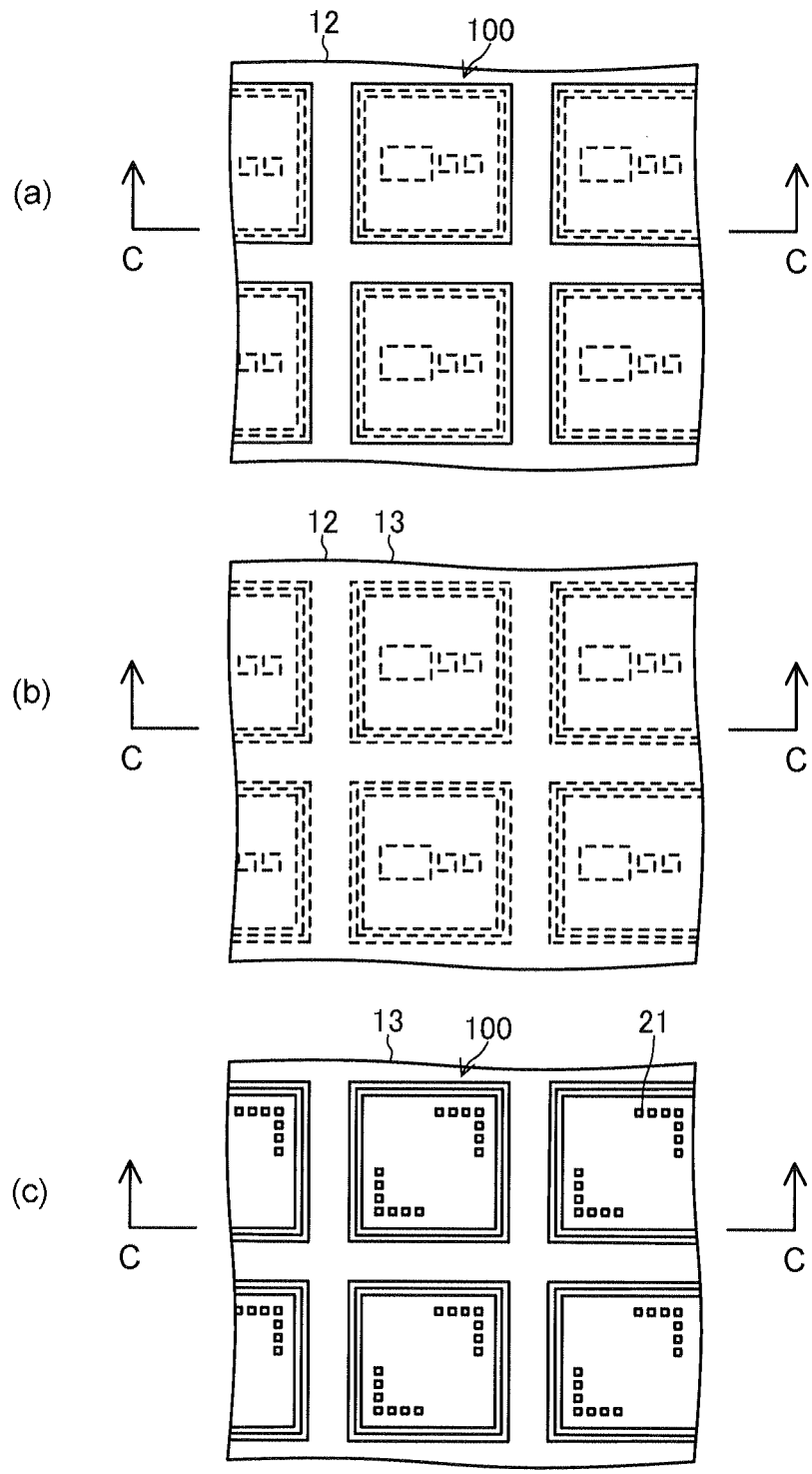
FIG. 11 (a, b, c) is an illustration showing states of respective steps of manufacturing the electronic component modules according to the third exemplary embodiment of the present invention.
Figure 12:
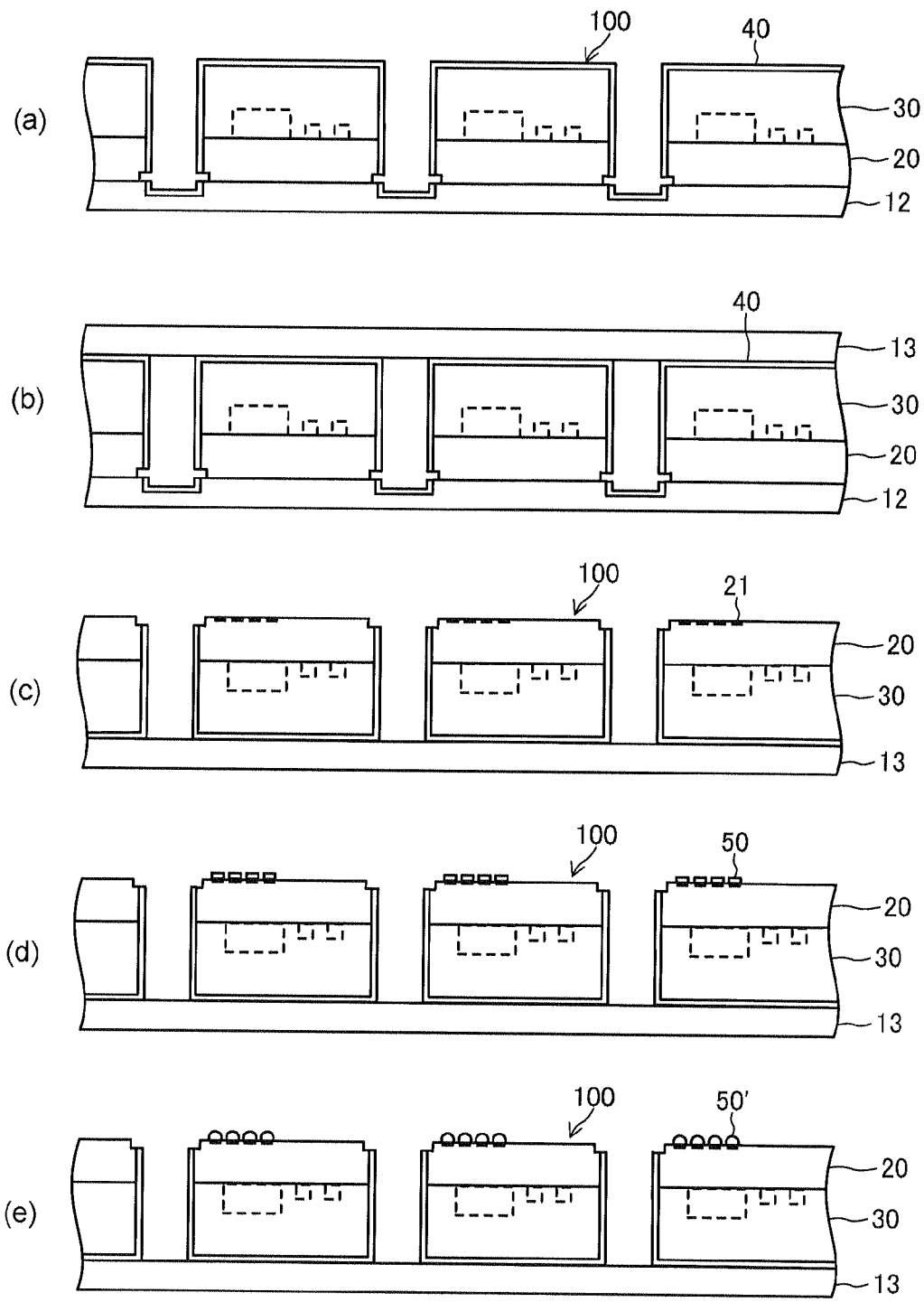
FIG. 12 (a, b, c, d, e) is an illustration showing cross-sectional views taken along the line C-C shown in FIG. 11 in the respective steps of manufacturing the electronic component modules according to the third exemplary embodiment of the present invention.

A third exemplary embodiment will be described with reference to FIGS. 10 to 12. FIG. 10 is a flowchart showing the operation of manufacturing electronic component modules according to the present embodiment. FIGS. 11 to 12 are illustrations showing states of respective steps of manufacturing the electronic component modules according to the present embodiment. In particular, FIG. 11 is a view seen from above the substrate 20, and FIG. 12 is a view seen from a side of the substrate 20, showing a cross-sectional view taken along the line C-C shown in FIG. 11.

The electronic component module of the present embodiment is configured such that a solder bump is formed on the connecting terminal 21 formed on the substrate 20 of the electronic component module 100 manufactured in the first exemplary embodiment. As a method of manufacturing the electronic component module 100 is almost similar to that described in the first exemplary embodiment, the description is not repeated. The steps of forming a solder bump will be described in detail.

FIGS. 11(a) and 12(a) show a state where electroless plating is applied, as described in step 8 of FIG. 1 of the first exemplary embodiment. As such, because the space section 22' is formed, the electronic component module 100 which is cut into a piece is not linked with the second sheet by the metal film 40. In this state, while the electronic component module 100 is manufactured completely when being removed from the second sheet 12, in the present embodiment, a solder bump electrode 50' is additionally formed on the connecting terminal.

From the state of step 8 of FIG. 1 as described above, as shown in FIGS. 11(b) and 12(b), a viscous heat-resisting third sheet 13 is further attached to the top of the metal film 40 formed on the top surface side of the electronic component module 100, that is, a side opposite to the second sheet 12 side of the electronic component module 100 (step S31). Then, as shown in FIGS. 11(c) and 12(c), the second sheet 12 is torn off to be removed from the electronic component module 100 (step S32). FIGS. 11(c) and 12(c) show a state where the second sheet 12 is removed from the state shown in FIGS. 11(b) and 12(b) and turned back, and the electronic component modules 100 are fixedly held by the third sheet 13.

The third sheet 13 only needs to have a heat resisting property of a level capable of withstanding a temperature of solder reflow and a viscosity capable of fixedly holding the electronic component modules 100. For example, Magic Resin (Registered Trademark) may be used.

Then, as shown in FIG. 12(d), a solder paste 50 is applied to each of the connecting terminals 21 formed on the connecting terminal surface of the substrate 20 constituting each of the electronic component modules 100 (step S33). For example, the solder paste 50 may be applied by applying a mask corresponding to the position of the connecting terminal 21 to the connecting terminal surface side of the substrate 20, and printing the solder paste 50. However, a method of applying the solder paste 50 is not limited to the above method.

Then, solder reflow is performed in a state where the electronic component module 100, to which the solder paste 50 is applied, is attached to the third sheet 13 (step S34). Thereby, the solder bump electrode 50' is formed on each of the connecting terminals 21 of each of the electronic component modules 100. Then, the electronic component module is removed from the third sheet 13 (step S35).

As described above, by forming the solder bump electrode 50' on the electronic component module 100 as a final step of the manufacturing process, the quality of the electronic component module 100 can be improved. Unlike the present invention, if a substrate with a solder bump electrode is used from the first step of the manufacturing process, as the solder bump electrode is present in every step, the strength of the solder bump may not be durable so that the solder bump electrode may be crushed, or when electroless plating is applied, electrons may enter the space section 22' depending on the size of the solder bump electrode so that portions where plating should not be applied may be applied with the electroless plating. However, by setting formation of the solder bump electrode 50' as a final step in the series of manufacturing process, such problems are solved, and the product quality can be improved.

The invention claimed is:

1. An electronic component module comprising:
   a substrate;
   an electronic component mounted on an electronic component mounting surface of the substrate;
   an insulating body that covers the electronic component on the electronic component mounting surface of the substrate; and
   a metal film formed by electroless plating, the metal film covering an exterior surface of the insulating body and a side surface of the substrate, wherein
   the substrate has a space section in which a space is formed, the space being dented inward of the substrate in the periphery of a surface opposite to the electronic component mounting surface of the substrate, and
   the metal film formed by electroless plating entirely covers at least one side surface of the electronic component module except for a portion where the space section is formed.

2. The electronic component module according to claim 1, wherein
   the space section is formed in the entire periphery of the surface opposite to the electronic component mounting surface of the substrate, and
   the metal film entirely covers all side surfaces of the electronic component module.

3. The electronic component module according to claim 1, wherein
   the space section is formed in a stepped shape.

4. The electronic component module according to claim 3, wherein
   the space section formed in the stepped shape is formed such that a height in a thickness direction of the substrate is in a range from 5 μm to 50 μm and a depth is 50 μm or more.

5. The electronic component module according to claim 3, wherein the space section formed in the stepped shape is formed such that a height in a thickness direction of the substrate is shorter than a depth in the substrate.

6. The electronic component module according to claim 5, wherein the space section formed in the stepped shape is formed such that a height in a thickness direction of the substrate is in a range from 5 μm to 50 μm and a depth is in a range of 50 μm to 100 μm.

7. The electronic component module according to claim 5, wherein the space section formed in the stepped shape is sized and positioned such that electrons discharged by oxidization of a reducing agent contained in a plating solution used in the plating of the metal film will not enter into the space section to a degree sufficient to form a portion of the metal film therein.

8. The electronic component module according to claim 3, wherein:
   the space section formed in the stepped shape is formed such that a height in a thickness direction of the substrate is shorter than a depth in the substrate, and
   the metal film formed by electroless plating entirely covers all side surfaces of the electronic component module except for where the space section is formed.

9. The electronic component module according to claim 1, wherein the metal film formed by electroless plating entirely covers at least one side surface of the electronic component module except for a portion where the space section is formed.

10. The electronic component module according to claim 1, wherein the metal film formed by electroless plating entirely covers all side surfaces of the electronic component module except for where the space section is formed.

11. An electronic module manufacturing method comprising:
    mounting an electronic component on an electronic component mounting surface of a substrate;
    covering the electronic component with an insulating body on the electronic component mounting surface of the substrate;
    in a state where the substrate is disposed on a predetermined sheet member, cutting into a piece of electronic component module or a set of electronic component modules while remaining at least a part of the sheet member;
    covering an exterior surface of the insulating body and a side surface of the substrate with a metal film by electroless plating; and
    before the substrate is disposed on the predetermined sheet member, providing a space section in which a space, dented inward of the substrate, is formed in at least a part of the periphery of a surface opposite to the electronic component mounting surface of the substrate in a state where the electronic component module or the set of electronic component modules are cut, wherein
    the covering with the metal film formed by electroless plating includes entirely covering, with the metal film formed by electroless plating, at least one side surface of the electronic component module except for a portion where the space section is formed.

12. The electronic module manufacturing method according to claim 11, wherein
    the providing the space section includes forming a space, dented inward of the substrate, in the entire periphery of the surface opposite to the electronic component mounting surface of the substrate, and
    the covering with the metal film includes entirely covering all side surfaces of the electronic component module.

13. The electronic module manufacturing method according to claim 11, wherein
    the providing the space section includes forming the space section in a stepped shape and forming the space section such that a height in a thickness direction of the substrate is in a range from 5 μm to 50 μm and a depth is 50 μm or more.

14. The electronic module manufacturing method according to claim 11, further comprising:
    after the covering with the metal film, attaching another sheet, capable of withstanding reflow of a predetermined temperature, on a surface covered with the metal film located opposite to the predetermined sheet member, and tearing off the predetermined sheet member from the surface opposite to the electronic component mounting surface of the substrate, and then
    applying a solder paste on a predetermined terminal previously provided on the surface opposite to the electronic component mounting surface of the substrate, and performing reflow, thereby forming a solder bump on the predetermined terminal.

15. The electronic module manufacturing method according to claim 11, wherein the covering with the metal film formed by electroless plating includes entirely covering, with the metal film formed by electroless plating, at least one side surface of the electronic component module except for where the space section is formed.

16. The electronic module manufacturing method according to claim 11, wherein the covering with the metal film formed by electroless plating includes entirely covering, with the metal film formed by electroless plating, each side surface of the electronic component module except for where the space section is formed.

17. The electronic module manufacturing method according to claim 11, wherein:
   the providing the space section includes forming the space section in a stepped shape, and
   the space section formed in the stepped shape is formed such that a height in a thickness direction of the substrate is shorter than a depth in the substrate.

18. The electronic module manufacturing method according to claim 17, wherein the space section formed in the stepped shape is formed such that a height in a thickness direction of the substrate is in a range from 5 μm to 50 μm and a depth is in a range of 50 μm to 100 μm.

19. The electronic module manufacturing method according to claim 17, wherein the space section formed in the stepped shape is sized and positioned such that electrons discharged by oxidization of a reducing agent contained in a plating solution used in the plating of the metal film will not enter into the space section to a degree sufficient to form a portion of the metal film therein.

20. The electronic module manufacturing method according to claim 17, wherein the metal film formed by electroless plating entirely covers all side surfaces of the electronic component module except for where the space section is formed.

* * * * *